(12) United States Patent (10) Patent No.: US 7,948,257 B2
Meagher et al. (45) Date of Patent: May 24, 2011

(54) METHOD AND APPARATUS FOR TESTING AND PROTECTING DIGITAL OUTPUT CIRCUITS

(75) Inventors: Thomas Bruce Meagher, Houston, TX (US); Gerald Robert Creech, Danbury (GB); Robert Sidney Ord, Horley (GB)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 115 days.

(21) Appl. No.: 12/393,431

(22) Filed: Feb. 26, 2009

(65) Prior Publication Data

US 2009/0219049 A1 Sep. 3, 2009

Related U.S. Application Data

(60) Provisional application No. 61/032,618, filed on Feb. 29, 2008.

(30) Foreign Application Priority Data

Sep. 26, 2008 (EP) ...................................... 08165293

(51) Int. Cl.
*G01R 31/26* (2006.01)
(52) U.S. Cl. .................................. 324/762.01
(58) Field of Classification Search ........................ None
See application file for complete search history.

(56) References Cited

U.S. PATENT DOCUMENTS

| 6,400,163 | B1 | 6/2002 | Melcher et al. |
| 2008/0018516 | A1* | 1/2008 | Meagher ....................... 341/155 |

FOREIGN PATENT DOCUMENTS

| EP | 1837971 | 9/2007 |
| EP | 1837991 | 9/2007 |
| EP | 1837992 | 9/2007 |
| WO | WO 2005/052610 | 6/2005 |

OTHER PUBLICATIONS

European Search Report.

* cited by examiner

*Primary Examiner* — Jermele M Hollington
(74) *Attorney, Agent, or Firm* — Boyle Fredrickson LLP; William R. Walbrun; John M. Miller

(57) ABSTRACT

A method and system for testing and protecting the operability of an output module. An output channel includes a transistor having a gate, a source, and a drain. The output channel drives a load with a load voltage and a load current in dependence upon a gate drive signal applied to the gate. The system determines a voltage threshold and a current threshold and monotonically varies the gate drive signal from a starting value for a predetermined time interval while monitoring the load current and the load voltage. The system returns the gate drive signal to the starting value if any of the load voltage reaches the voltage threshold, the load current reaches the current threshold, or a predetermined time interval expires indicating the condition of the output module.

12 Claims, 11 Drawing Sheets

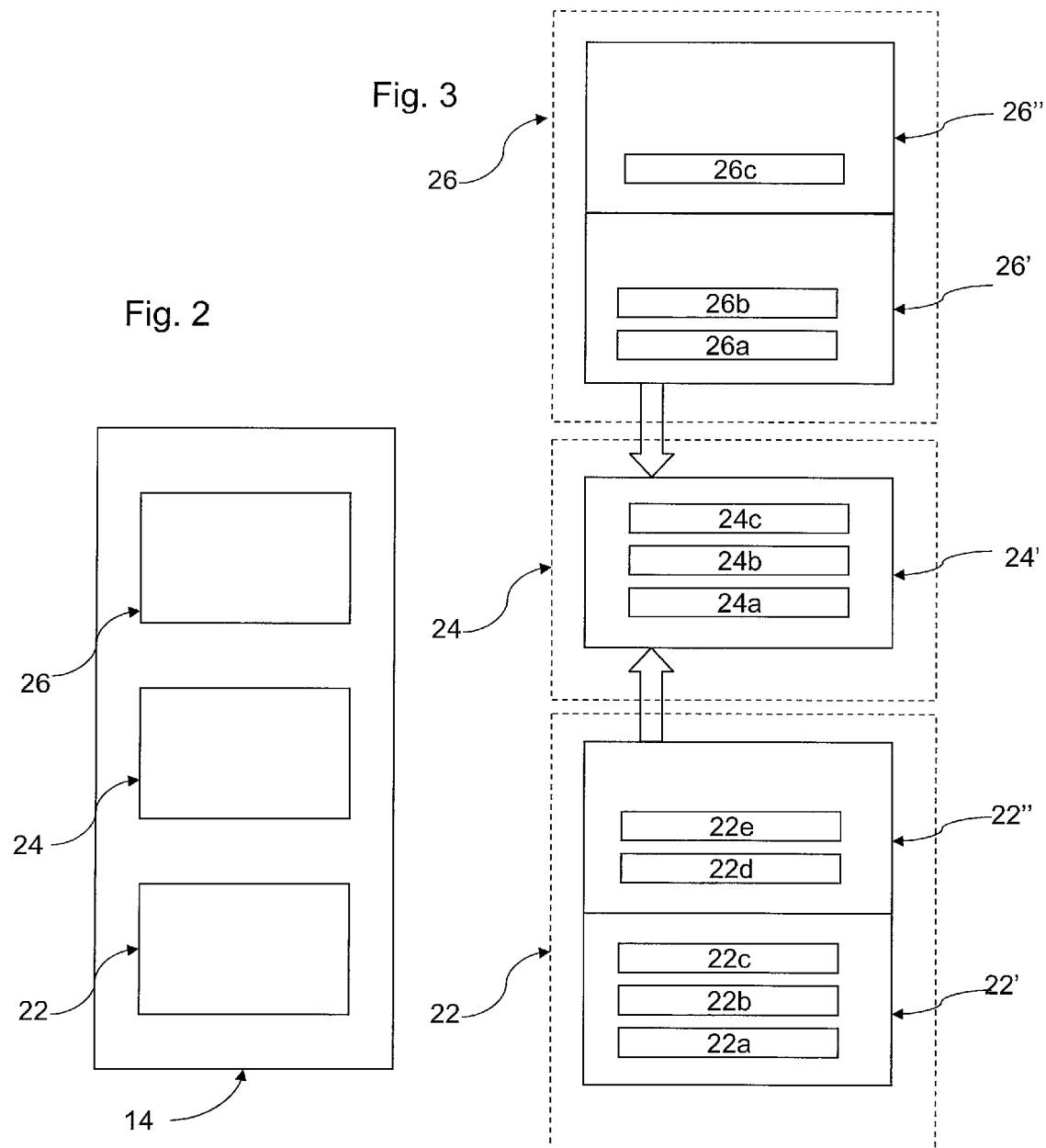

METHOD AND APPARATUS FOR TESTING AND PROTECTING DIGITAL OUTPUT CIRCUITS

CROSS REFERENCE TO RELATED APPLICATIONS

This application claims priority to U.S. Provisional Application Ser. No. 61/032,618 filed on Feb. 29, 2008 and European Patent Application No. EP08165293 filed on Sep. 26, 2008, the disclosures of which are expressly incorporated herein.

BACKGROUND a. Field of the Invention

This invention relates to testing and protecting an output module for an Industrial Process Control System in particular for an Industrial Process Control System Suitable for exemplary systems such as:

Emergency Shutdown systems;
Critical process control systems;
Fire and Gas detection and protection systems;
Rotating machinery control systems;
Burner management systems;
Boiler and furnace control systems; and
Distributed monitory and control systems.

Such control systems are applicable to many industries including oil and gas production and refining, chemical production and processing, power generation, paper and textile mills and sewage treatment plants.

b. Related Art

In industrial process control systems, fault tolerance is of utmost importance. Fault tolerance is the ability to continue functioning in the event of one or more failures within the system.

Fault tolerance may be achieved by a number of different techniques, each with its specific advantages and disadvantages An example of a system which provides redundancy is a Triple Modular Redundancy (TMR) system. Using TMR, critical circuits are triplicated and perform identical functions simultaneously and independently. The data output from each of the three circuits is voted in a majority-voting circuit, before affecting the system's outputs. If one of the triplicated circuits fails, its data output is ignored. However, the system continues to output to the process the value (voltage, current level, or discrete output state) that agrees with the majority of the functional circuits. TMR provides continuous, predictable operation.

However, TMR systems are expensive to implement if full TMR is not actually a requirement, and it is desirable to utilise an architecture which provides flexibility so that differing levels of fault tolerance can be provided depending upon specified system requirements.

Another approach to fault tolerance is the use of hot-standby modules. This approach provides a level of fault tolerance whereby the standby module maintains system operation in the event of module failure. With this approach there may be some disruption to system operation during the changeover period if the modules are not themselves fault-tolerant.

Fault tolerant systems ideally create a Fault Containment Region (FCR) to ensure that a fault within the FCR boundary does not propagate to the remainder of the system. This enables multiple faults to co-exist on different parts of a system without affecting operation.

Fault tolerant systems generally employ dedicated hardware and software test and diagnostic regimes that provide very fast fault recognition and response times to provide a safer system.

Safety control systems are generally designed to be 'fail-operational/fail-safe'. Fail operational means that when a failure occurs, the system continues to operate: it is in a fail-operational state. The system should continue to operate in this state until the failed module is replaced and the system is returned to a fully operational state.

An example of fail safe operation occurs, for example if, in a TMR system, a failed module is not replaced before a second failure in a parallel circuit occurs, the second failure should cause the TMR system to shut down to a fail-safe state. It is worth noting that a TMR system can still be considered safe, even if the second failure is not failsafe, as long as the first fault is detected and announced, and is itself failsafe.

It is desirable to automatically test failsafe digital output channels. In particular it is useful if a short circuit fault in one of the two series switches may be detected.

It is desirable to test the digital output channels for the ability to be de-energized without requiring the presence of a minimum load current in order for its interruption to be detected. This is especially useful in a fault tolerant output channel configuration where two outputs are concurrently driving the same load in parallel.

Ideally digital output channels and their loads are protected from over-voltage transients, ideally monitoring for open and short circuit faults in an energised as well as de-energised state.

SUMMARY OF THE INVENTION

According to the invention there is provided a method of testing an output channel that overcomes one or more of the concerns discussed above One aspect of the invention includes an output channel that comprises a transistor having a gate, a source, and a drain, and driving a load with a load voltage and a load current in dependence upon a gate drive signal applied to said gate. A method of testing the channel includes determining a voltage threshold; determining a current threshold; monotonically varying the gate drive signal from a starting value for a predetermined time interval; monitoring the load current; monitoring the load voltage; and if the load voltage reaches the voltage threshold, the load current reaches the current threshold, or the predetermined time interval expires, returning the gate drive signal to the starting value.

Preferably, the gate drive signal is generated by an operational amplifier that receives a command signal and a ramp signal and, in the event a monotonically varying gate drive signal is to be generated, the ramp signal comprises a high frequency pulsed signal.

Another aspect of the invention usable with the above aspects includes configuring the output channel to include a transient suppression module having two avalanche diodes that are in series with two resistors in parallel with, and forming a voltage divider across, the diodes. In a preferred aspect, the monitored load voltage is used to detect short circuit faults of the avalanche diodes.

In another aspect useable with one or more of the above aspects, a gate drive signal starting value causes the load to be energised and monotonically varying the gate drive signal causes the load to become partially de-energised.

In another aspect, the gate drive signal starting value causes the load to be de-energised and monotonically varying the gate drive signal causes the load to become partially energised.

Where the load is being partially de-energised, the method may further include breaking the connection between the channel and the load; and monitoring the voltage across a test resistor.

As an alternate aspect, the output channel may comprise a first and a second transistor that are in series. Either one of the transistors may be controlled using one of more of the aspects of the method described above.

According to another aspect of the invention, there is provided an apparatus having an output channel that includes a transistor having a gate, a source, and a drain. A load is driven with a load voltage and a load current in dependence upon a gate drive signal applied to said gate. The apparatus includes a driver that generates the drive signal and a processor that controls the driver and is connected to receive signals that indicate the load voltage and the load current. The processor is arranged in operation to control the driver to monotonically vary the gate drive signal from a starting value for a predetermined time interval; monitor the load current; and monitor the load voltage. If the load voltage reaches a predetermined voltage threshold, if the load current reaches a predetermined current threshold, or the predetermined time interval expires, the processor controls the driver to return the gate drive signal to the starting value.

In one aspect, the driver includes an operational amplifier that receives a command signal and a ramp signal and, in the event a monotonically varying gate drive signal is to be generated, the ramp signal includes a high frequency pulsed signal which is low pass filtered before an op amp to produce a variable low frequency gate drive signal.

In one aspect, the output channel may further include a transient suppression module having two avalanche diodes that are in series with two resistors that are in parallel with and forming a voltage divider across the avalanche diodes. The processor is arranged to use the monitored load voltage to detect short circuit faults of the avalanche diodes.

According to another aspect, the output channel may further include a reverse blocking circuit and a test resistor in parallel with the load. In operation, the processor is arranged to cause the reverse blocking circuit to break a connection between the channel and the load; control the driver to set the gate drive signal starting value to cause the load to be energised to monotonically vary the gate drive signal to cause the load to become partially de-energised; and to monitor the voltage across the test resistor.

BRIEF DESCRIPTION OF THE DRAWINGS

Embodiments of the invention will now be described, by way of example only, with reference to the accompanying drawings, in which:

FIG. 2 illustrates schematically a controller of the industrial process control system illustrated in FIG. 1;

FIG. 3 illustrates a possible configuration of a controller in accordance with FIG. 2;

DETAILED DESCRIPTION

Figure 1:
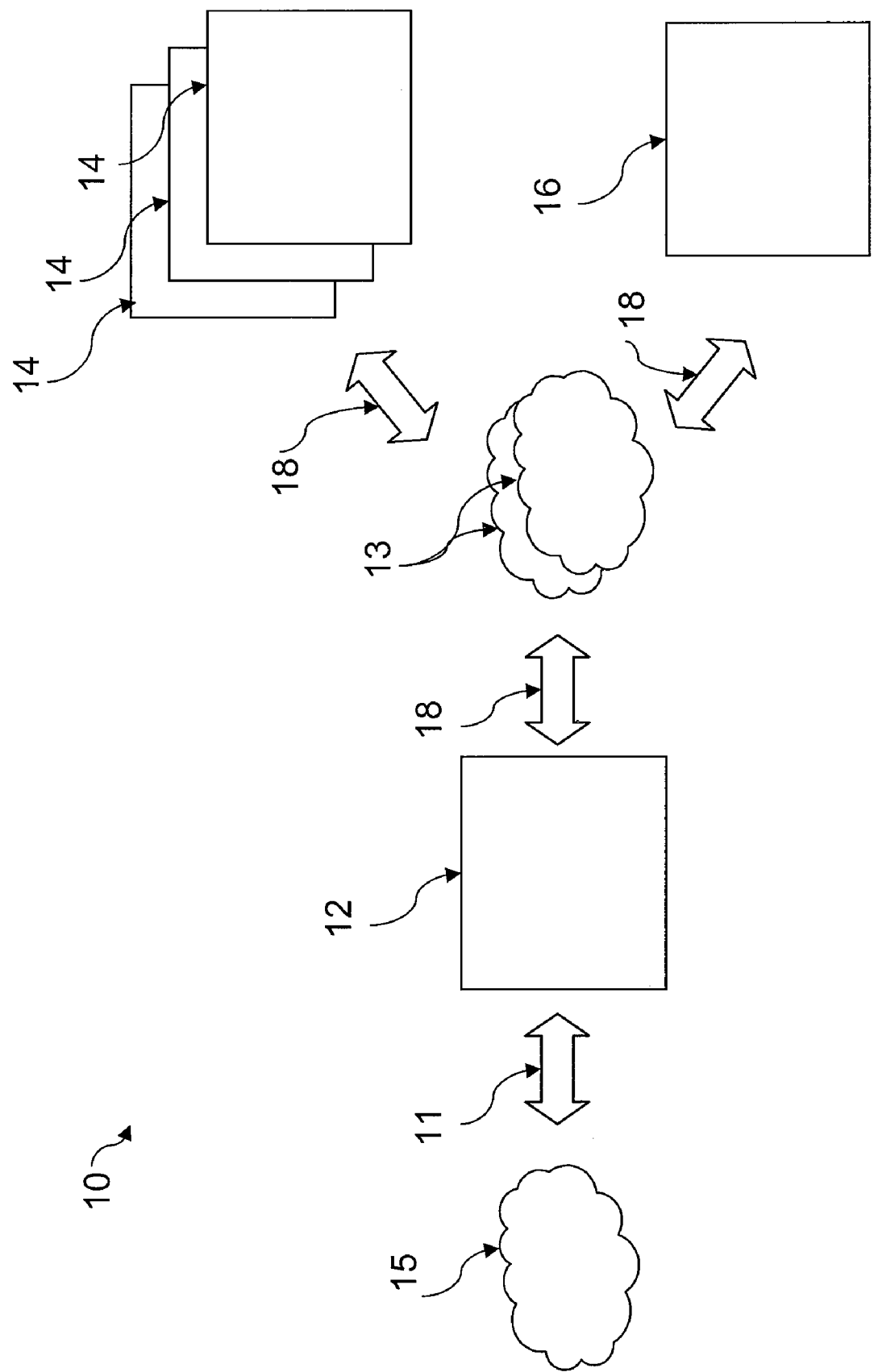
FIG. 1 is an illustration showing the architecture of a distributed industrial process control system which uses the apparatus and method of the present invention.

In the Industrial Process Control System shown in FIG. 1, a distributed architecture is designed to be used in different Safety Integrity Level (SIL) environments, so that if a high SIL is required it can be provided, but if a low SIL is all that is needed the system can be reduced in complexity in order to reduce unnecessary extra costs.

An exemplary Industrial Process Control System 10, comprises a workstation 12 one or more controllers 14 and a gateway 16. The workstation 12 communicates with the controllers 14 and the gateway 16 via Ethernet connections 18 to one or more control networks 13. Multiple Ethernet connections 18 provide redundancy to improve fault tolerance. The workstation 12 may be connected via a conventional Ethernet connection 11 to another external network 15.

A controller 14 will now be described in more detail with reference to FIGS. 2 and 3.

FIG. 2 illustrates a schematic diagram of the controller 14 comprising an input assembly 22, a processor assembly 24 and an output assembly 26. In this schematic illustration the input assembly 24 and output assembly 26 are on different backplanes but they may equally well share a single backplane.

Assemblies 22, 24, 26 are created from one or more communications backplane portions which have three slots to accommodate up to three modules together with termination assemblies which have one two or three slots, and which interface to field sensors and transducers. A termination assembly may straddle two contiguous backplane portions. A module comprises a plug in card with multiple connectors for plugging onto a communications backplane and a termination assembly.

It will be appreciated that having three slots in a communications backplane portion is one design option and other design options with greater (or fewer) slots are possible without departing from the scope of the invention as defined in the appended claims.

FIG. 3 illustrates a possible physical configuration of the controller 14. In this embodiment of the invention, the input assembly 22, output assembly 26 and processor assembly 24 are physically separated from one another by grouping the modules of different types onto separate communications backplanes.

In the example shown, the input assembly 22 comprises two communications backplane portions, 22', 22". The first backplane portion 22' has a triplex input termination assembly and three input modules 22a, 22b, 22c, the second backplane portion 22" has a duplex input termination assembly 22" and two input modules 22c, 22d. The processor assembly 24 comprises a single processor backplane portion 24' having three processor modules 24a, 24b and 24c. The output assembly 26 comprises two backplane portions 26', 26". The first backplane portion 26' has a duplex output termination assembly with two output modules 26a, 26b and the second backplane portion 26" has a simplex output termination assembly with a single output module 26c.

Figure 4:
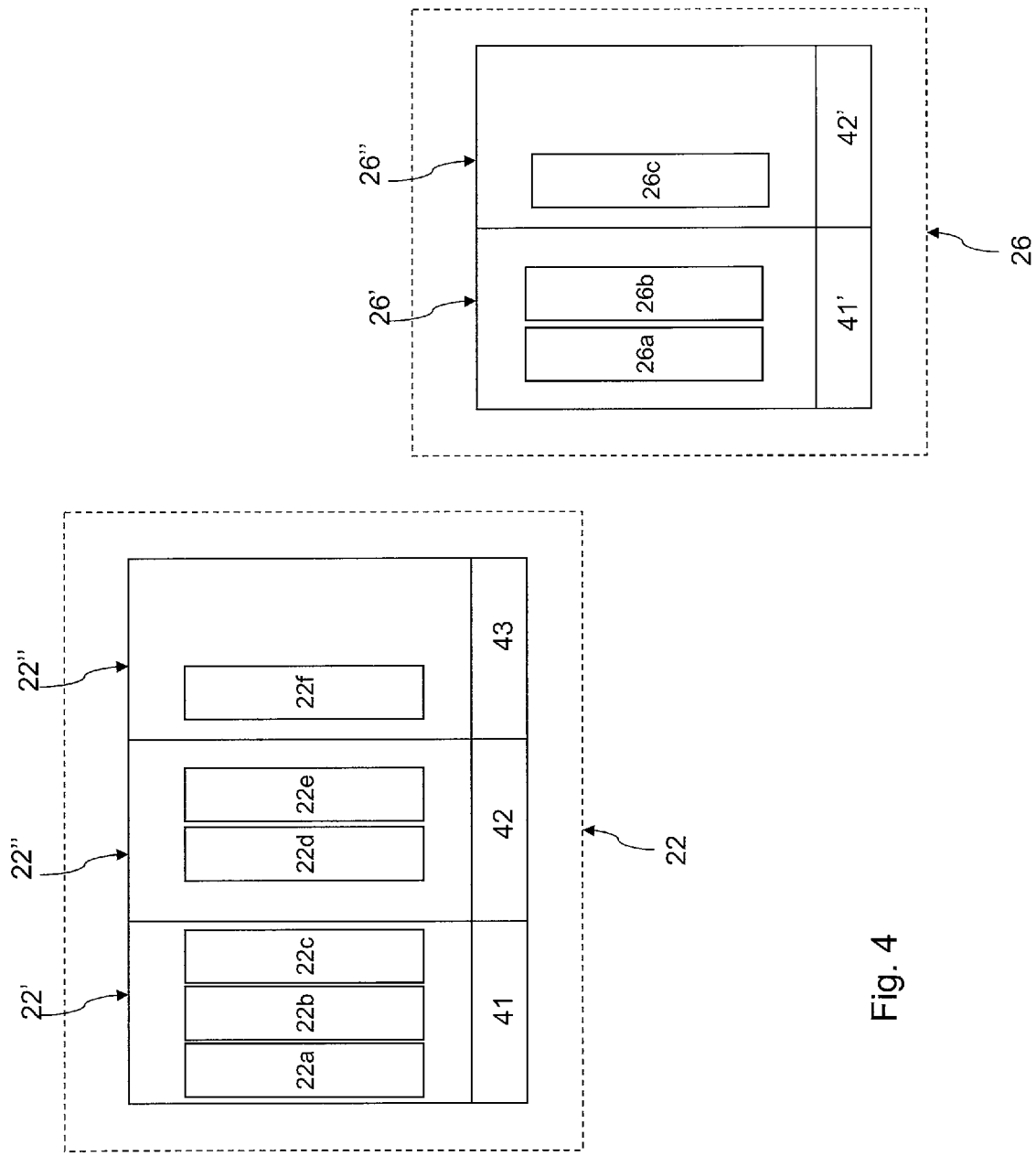
FIG. 4 shows various options for an input assembly and output assembly of FIG. 3.

The flexibility of the input assembly 22, will now be described, in more detail with reference to FIG. 4.

An input assembly 22 comprises one or more backplane portions and termination assemblies 22' 22" 22'" etc. For example, a triplex portion 22' having three modules 22a, 22b, 22c might be used to satisfy a high availability requirement, a duplex portion 22" having two modules 22d, 22e might be provided for fault tolerant applications, and a simplex portion 22'" with a single module 22f might be provided for failsafe applications. The termination assemblies may be provided with different types of field conditioning circuits. For example assembly 22' may be provided with a 24V DC field conditioning circuit 41, assembly 22" may be provided with a 120V DC field conditioning circuit 42, and assembly 22'" may be provided with a 4-20 mA field conditioning circuit 43. Similarly possible configurations are shown for an output assembly 26. It will be appreciated that numerous configurations of backplane portions and termination assemblies with various different numbers of modules and various different types of field conditioning circuits are possible and the invention is not limited to those shown in these examples.

Where an assembly provides more than one module for redundancy purposes it is possible to replace a failed module with a replacement module whilst the industrial process control system is operational which is also referred to herein as online replacement (ie replacement is possible without having to perform a system shutdown). Online replacement is not possible for a simplex assembly without interruption to the process. In this case various "hold last state" strategies may be acceptable or a sensor signal may also be routed to a different module somewhere else in the system.

The processor assembly configures a replacement processor module using data from a parallel module before the replacement module becomes active.

The field conditioning circuits 41, 42, 43 transform a signal received from a sensor to a desired voltage range, and distribute the signal to the input modules as required. Each field conditioning circuit 41, 42, 43 is also connected to field power and field return (or ground) which may be independently isolated on a channel by channel basis from all other grounds, depending on the configuration of the input termination assembly. Independent channel isolation is the preferred configuration because it is the most flexible. The field conditioning circuits 41, 42, 43 comprise simple non active parts and are not online replaceable.

Figure 5:
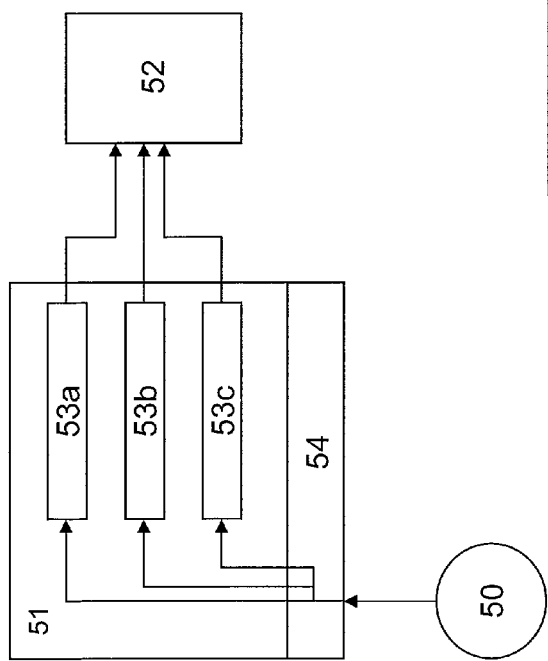
FIG. 5 shows one possible configuration implementing a two out of three voting strategy.
Figure 6:
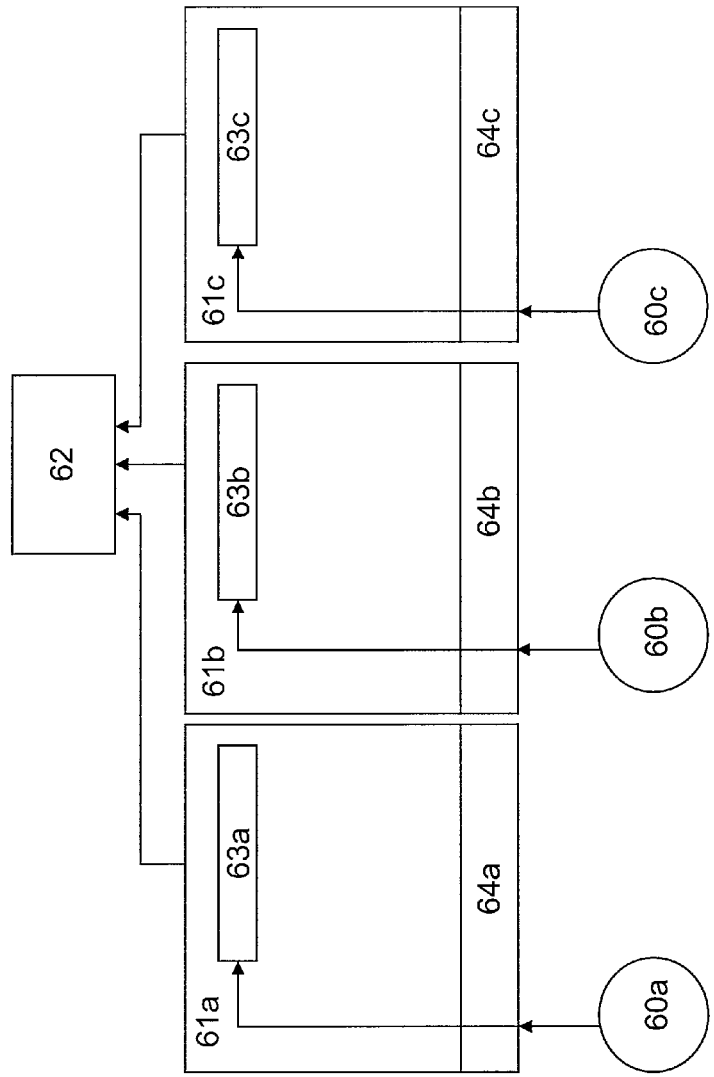
FIG. 6 illustrates a second possible configuration for a two out of three voting strategy.

FIG. 5 and FIG. 6 illustrate the flexibility of the architecture described herein showing different configurations for a triplex system for generating a signal with a high availability requirement. Referring to FIG. 5, a three module input assembly 51 receives a signal from a sensor 50 via a field conditioning circuit in termination assembly 54. The field conditioning circuit 54 transforms the signal to a desired voltage range and distributes the signal to three replicated input modules 53a, 53b, 53c. Each input module processes the signal and the results are sent to a two out of three voter 52 to generate a result signal in dependence thereon.

Referring to FIG. 6, replicated sensors 60a, 60b, 60c each send a signal to respective simplex assemblies 61a, 61b, 61c via respective field conditioning circuits in termination assemblies 64a, 64b, 64c. Each input module 63a, 63b, 63c processes the signal and sends an output to a two out of three voter 62 to generate a signal in dependence thereon. It will be appreciated that many variations and configurations are possible in addition to those illustrated here.

Figure 7:
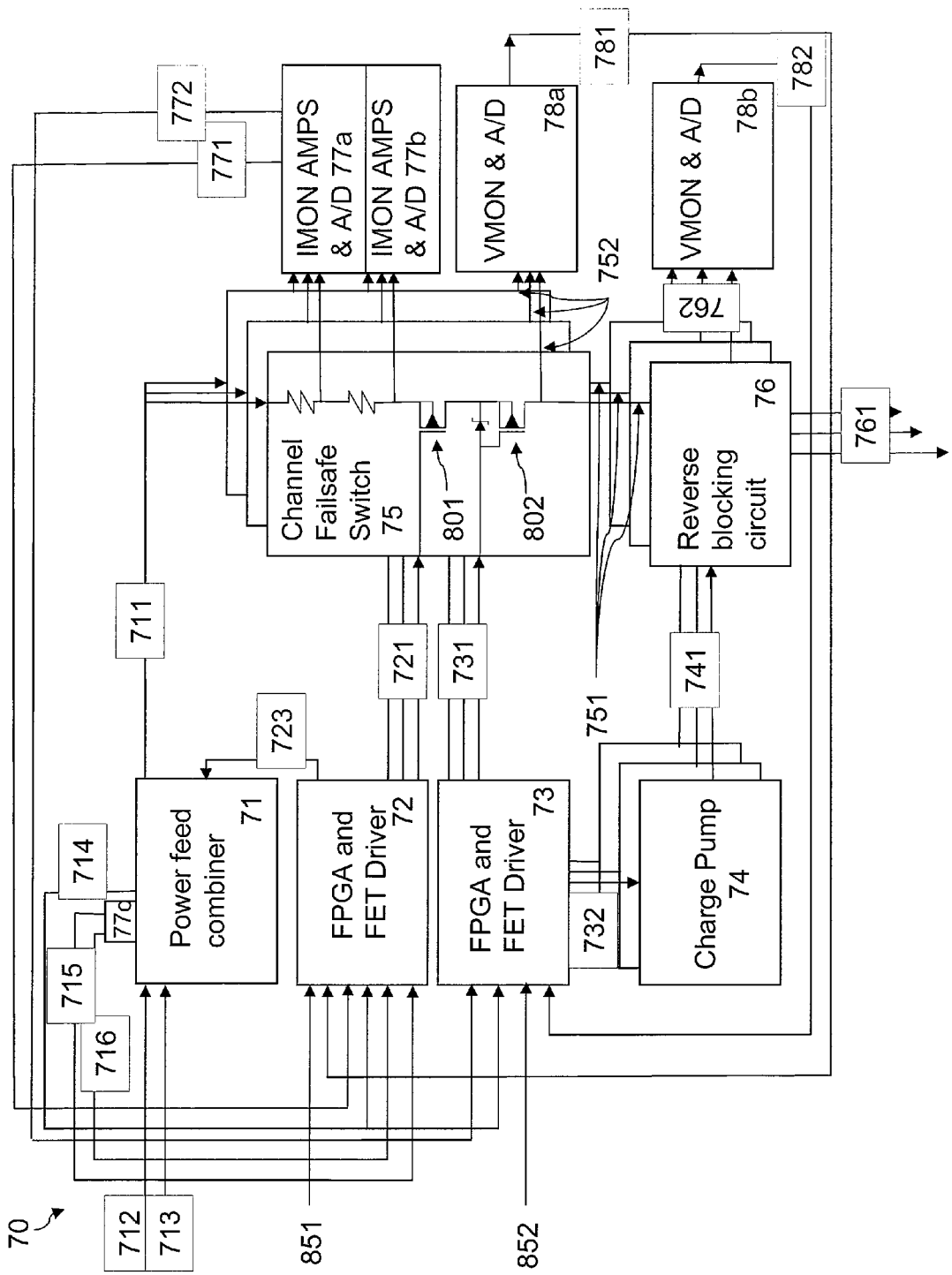
FIG. 7 illustrates an output module in accordance with the present invention.

FIG. 7 illustrates schematically an output module in accordance with the present invention.

An output module 70 comprises a power feed combiner 71, a first field programmable gate array (FPGA) and field effect transistor (FET) driver 72, a second FPGA and FET driver 73. The drivers 72, 73 control a plurality of channels each channel driving a load (not shown) each channel comprising a channel failsafe switch 75 connected to a respective reverse blocking circuit 76 each of which is driven by a respective charge pump (only three channels are shown schematically for clarity).

It will be appreciated that the incorporation of the control logic into an FPGA is not central to the invention; it is just a convenient implementation. The logic could equally well be implemented in an application specific integrated circuit (ASIC), or a general purpose microcomputer without departing from the scope of the invention as defined in the appended claims.

The current and voltages at various points in the channel are monitored by two arrays of current amplifiers and monitors and A/D converters 77a, 77b and two arrays of voltage monitors and A/D converters 78a and 78b. In a preferred embodiment of the invention there are eight output channels served by eight channel failsafe switches 75 and associated reverse blocking circuits 76.

The first FPGA and FET driver 72 generates a plurality of signals 721 each of which drives a first FET 801 in each switch 75. The second FPGA and FET driver 73 generates a plurality of signals 731 each of which drives a second FET 802 in each switch 75.

Each voltage monitor signal 781, and each current monitor signal 771 is fed back into the first FPGA and FET driver 72, each voltage monitor signal 782 and each current monitor signal 772 is fed back to the second FPGA and FET driver 73 where various functions are carried out in dependence thereon.

In a preferred embodiment of the invention channel failsafe switches 75 can be automatically tested. One of the FPGA and FET drivers 72, 73 is instructed to initiate a sequence whereby a channel under test is partially driven to the opposite state to that which it is currently commanded to. The channel current and voltage are continuously monitored by current amplifiers and monitors 77a, 77b and voltage monitors 78a, 78b which in combination with hardware logic in the FPGA and FET driver 72, 73 determine whether or not a FET 801, 802 in a channel failsafe switch 75 has reached a desired end state for the test.

Figure 8:
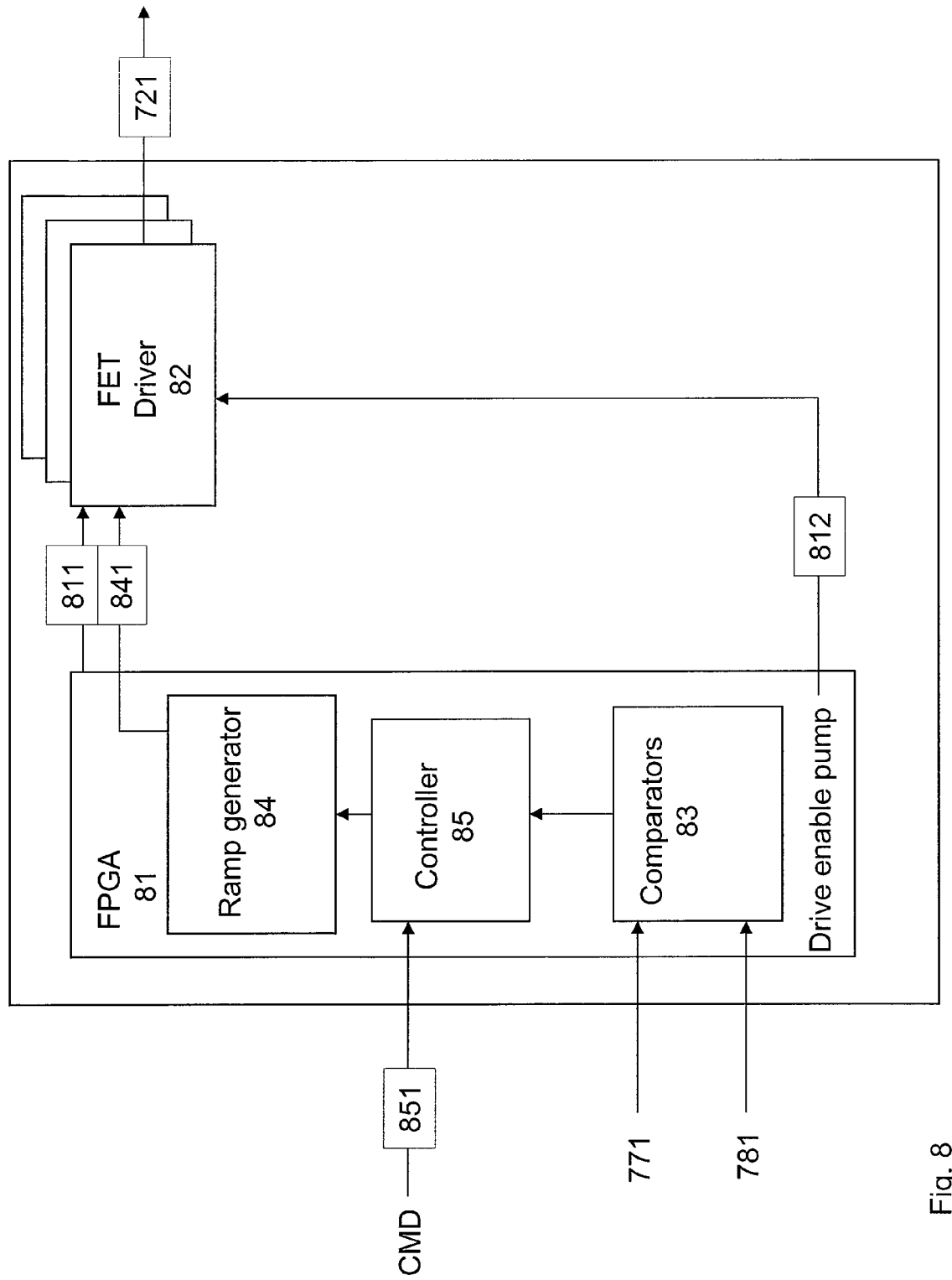
FIG. 8 is a block diagram illustrating an FPGA and FET driver of FIG. 7 in more detail.

FIG. 8 illustrates the FPGA and FET driver 72. The FPGA and FET driver 72 contains an FPGA 81 which controls a plurality of FET drivers 82. For clarity only three drivers 82 are shown in this schematic illustration, in the preferred embodiment there are eight drivers to drive each top FET (801, FIG. 7) in each channel failsafe switch 75 using respective signals 721. An enable signal 812 from the FPGA 81 is used to control the plurality of FET drivers 82. When the enable signal 812 is actively switching states at a high frequency the FET drivers 82 are enabled and when the enable signal 812 is not actively switching states the FET drivers 82 are disabled.

Figure 9:
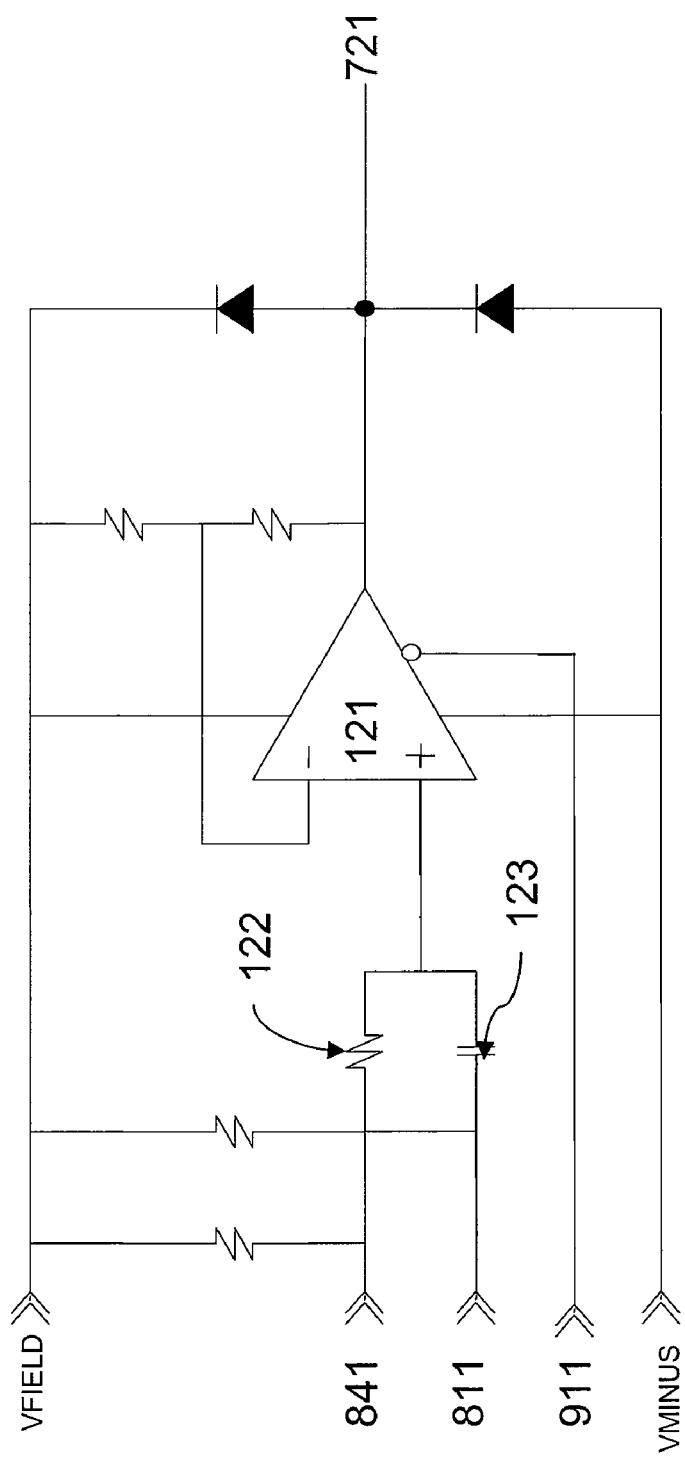
FIG. 9 is a block diagram illustrating the FET driver of FIG. 8 in more detail.

FIG. 9 illustrates the FET driver 82 in more detail although for clarity enabling circuitry receiving the enable signal 812 and generating shutdown signal 911 is omitted. The FET driver 81 is driven using two signals, a ramp signal 841 and a command signal 811 from the FPGA 81.

The command signal 811 is applied to an operational amplifier 121 through a capacitor 122. The ramp signal 841 is applied to the operational amplifier 121 through a resistor 123.

The command signal 841 and the ramp signal 811 are usually both set to '0' when the channel is 'on' and are usually both set to '1' when the channel is 'off'.

Referring back to FIG. 8, the FPGA contains a controller 85 which upon receipt of a ramp test command via command line 851 sends a corresponding command to a ramp generator 84 to cause the ramp generator 84 to activate the ramp signal 841 sent to the FET driver 82 in turn causing the FET driver 82 to generate a ramped driving signal 721. The ramped driving signal 721 is sent to the FET 801. The ramped driving signal may be either increasing or decreasing depending upon whether it is to partially turn on an FET 801 which is off to verify that it can be turned on, or to partially turn OFF an FET 801 to verify that it can be turned OFF as will be explained later with reference to FIGS. 10 and 11.

In the case of FPGA and FET driver 72 comparators 83 receive a monitored current signal 771 from current amplifiers and monitors 77a and a monitored voltage signal 781 from voltage amplifiers and monitors 78a.

In the case of FPGA and FET driver 73 comparators 83 receive a monitored current signal 772 from current amplifiers and monitors 77b and a monitored voltage signal 782 from voltage amplifiers and monitors 78b.

If either the monitored voltage or the monitored current reaches a threshold or predetermined maximum or minimum set in registers in the comparators 83 the test is terminated by causing the ramp generator 84 to cease activating the ramp signal 841.

Figure 10:
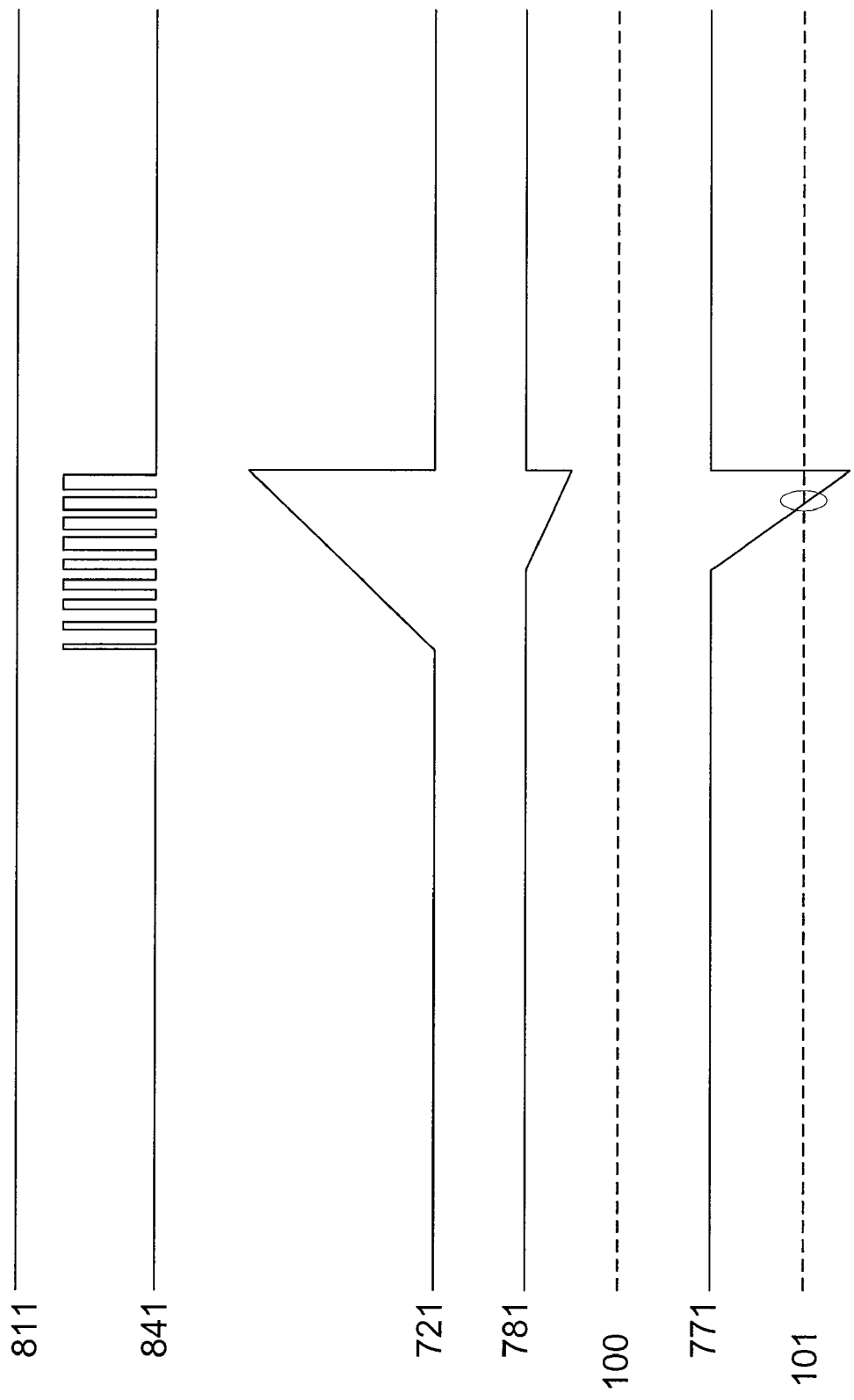
FIG. 10 illustrates signals in an exemplar method according to the present invention.

Referring now to FIG. 10, operation of this scheme is illustrated for a channel that is in the 'on' state before the test. Initially command signals 811 and 841 are both in a steady state '0' condition. Upon receipt of a test command via the controller 85, the FET drive gate voltage signal is ramped up by the application of a high frequency Pulse Width Modulated (PWM) or equivalently Pulse Ratio Modulated (PRM) ramp signal on command signal 841 to the FET driver 82.

The duty cycle (or logic '1' density) of the high frequency ramp signal 841 is increased until the comparators 83 detect that the predetermined maximum or minimum have been reached or the ramp signal has reached a steady logic '1' (this occurs after a predetermined time as the duty cycle of the high frequency ramp signal 841 is increased at a predetermined rate).

In the example shown in FIG. 10, the gate drive voltage signal 721 has a start value of −10V, the resulting monitored voltage 781 is initially 23V and the resulting monitored current 771 is initially 1A. When the high frequency ramp signal 841 is received by the operational amplifier 121 the gate drive signal 721 begins to rise and thus the monitored voltage 781 and the monitored current 771 begin to fall. In this example a predetermined voltage threshold 100 is set to 16V and a predetermined current threshold 101 is set to 750 mA. The illustration shows that the monitored current 771 reaches the predetermined current threshold 101 before the monitored voltage 781 reaches the predetermined voltage threshold 100. At this point the test is terminated and the high frequency ramp signal 841 is ceased, causing the gate drive signal 721 to return to its original starting value.

Figure 11:
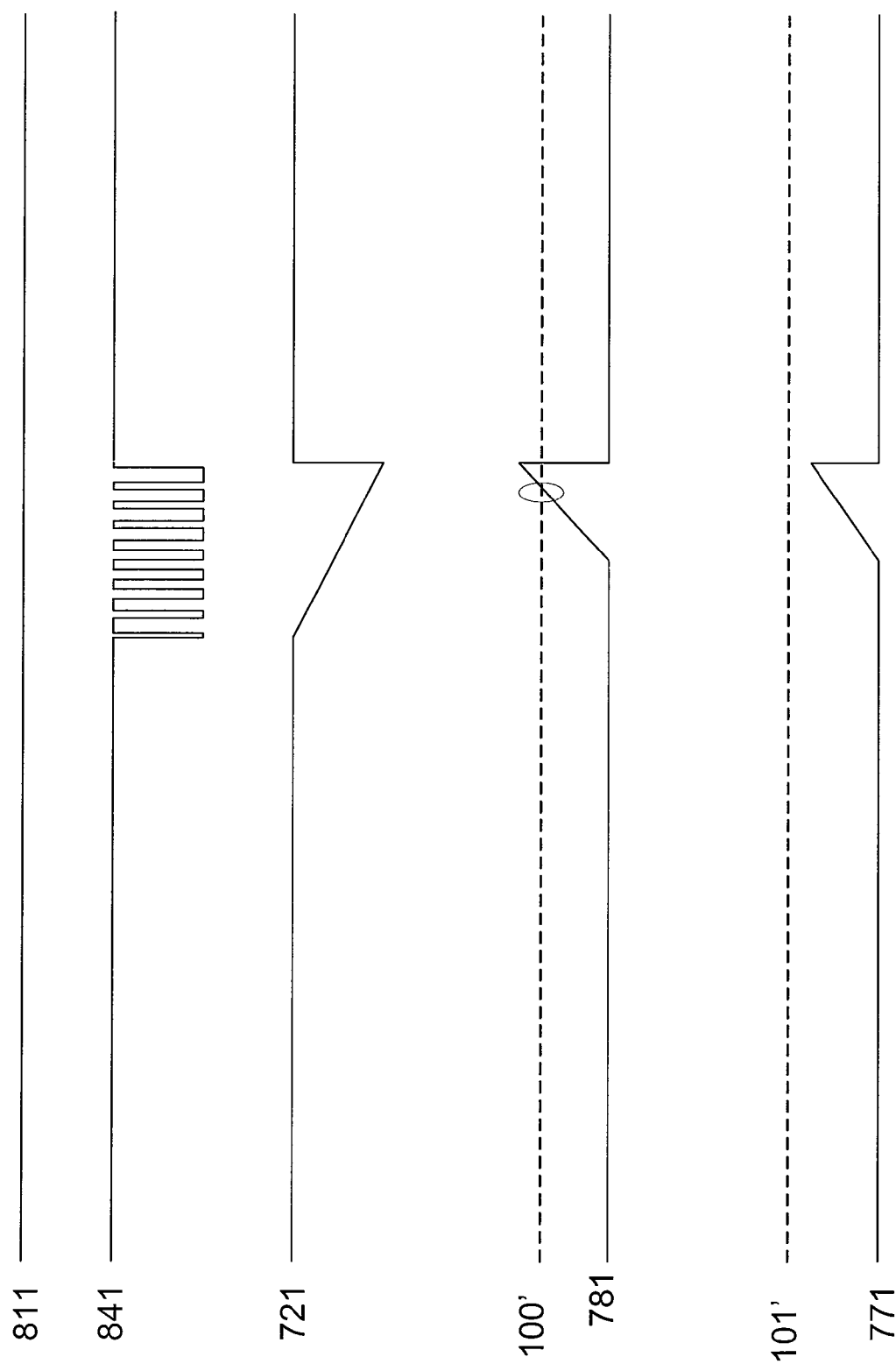
FIG. 11 illustrates signals in another exemplar method according to the present invention.

Referring now to FIG. 11, operation of the scheme is illustrated for a channel in the 'off' state before the start of the test. Initially the command signals 811 and 841 are both in a steady state '1' condition. Upon receipt of a test command via the controller 85, the drive voltage signal 721 is ramped down by application of a high frequency Pulse Width Modulated (PWM) or equivalently, Pulse Ratio Modulated (PRM) ramp signal 841 to the FET driver 82.

The logic '0' density of the high frequency ramp signal 811 is increased until the comparators 83 detect that the current or voltage threshold has been crossed or a predetermined time limit has been exceeded (ie when the ramp signal 841 reach a steady state logic '0'.

In the example shown in FIG. 11, the gate drive voltage signal 721 has a start value of 0V, the resulting monitored voltage 781 is initially 0V and the resulting monitored current 771 is initially 0A. When the high frequency ramp signal 841 is received by the operational amplifier 121 the gate drive signal 721 begins to fall and thus the monitored voltage 781 and the monitored current 771 begin to rise. In this example a predetermined voltage threshold 100' is set to 3V and a predetermined current threshold 101' is set to 50 mA. The illustration shows that the monitored voltage 781 reaches the predetermined voltage threshold 100' before the monitored current 771 reaches the predetermined current threshold 101'. At this point the test is terminated and the high frequency ramp signal 841 is ceased, causing the gate drive signal 721 to return to its original staring value.

It will be appreciated that for this test mode to operate correctly, the other FET in the channel failsafe switch 75 must be set to the 'on' state prior to commencing the test sequence, preferably with an over-voltage/over-current trap in place. This is performed by running the ramp test as described above, but with the expectation for the ramp to reach the terminal state without the current or voltage thresholds being reached, as that would signify the existence of a pre-existing short circuit fault in the other FET.

When testing a channel which is 'off' it is desirable to avoid fully energizing the output channel, even briefly, during channel and field fault testing. Using a partial-on test as described above allows detection of short circuit switch faults to be provided when the channel is 'off'.

It will be appreciated that the present invention has been described with reference to an FPGA but the invention could equally well be implemented using discrete logic components, a microprocessor, or an ASIC.

Figure 12:
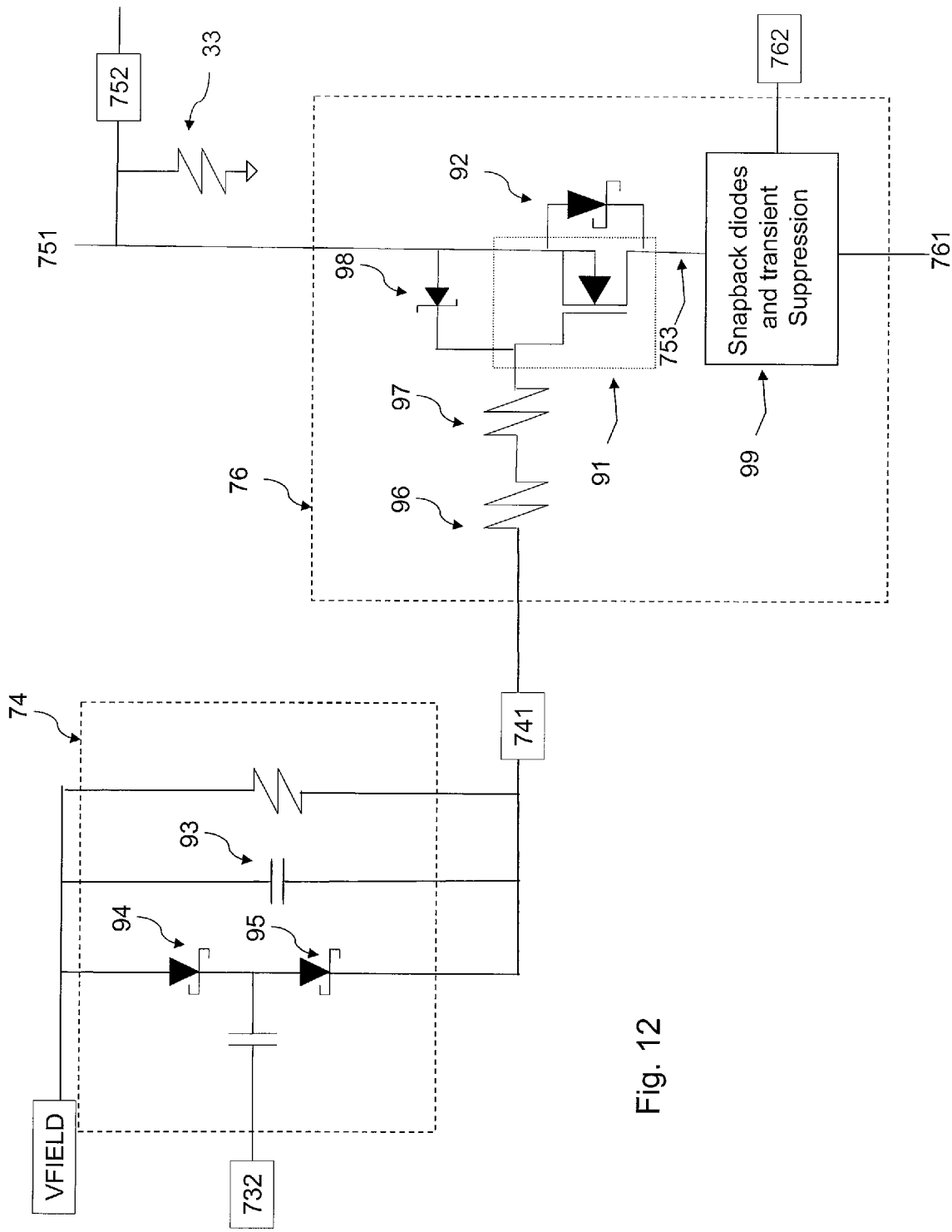
FIG. 12 illustrates a conventional charge pump, and a reverse blocking circuit in accordance with the present invention.

As shown in FIG. 12, the reverse blocking circuit 76 comprises a reverse blocking transistor 91 which is a high current N channel MOSFET. The reverse blocking transistor 91 is driven using a charge pump signal 732 generated by a control circuit resident in the FPGA and FET driver 73. The current through the transistor 91 and the voltage across it is monitored and sent to the FPGA and FET driver 73 via A/D converter channels and amplifiers 77b, 78b.

When reverse current is detected flowing into the digital outputs, then the reverse blocking transistor 91 is turned off, to break the connection to the external power source.

The use of a low voltage charge pump 74 to generate the positive turn-on bias voltage required by the reverse blocking transistor simplifies the power supply requirements for the output module.

FIG. 12 illustrates a simple low voltage implementation of a conventional charge pump (sometimes referred to as a diode-capacitor voltage multiplier). Each transition of the charge pump signal 732 transfers some charge from a square wave driver into an output capacitor 93 as constrained by switching diodes 94, 95.

The reverse blocking transistor 91 may also be turned off when channel diagnostic tests are to be run on the channel failsafe switch 75. The reverse blocking transistor 91 may also be tested periodically on channel by turning it off and examining the change in channel voltage. Two high resistance resistors 96, 97 in series with the gate, together with a Zener diode 98 from gate to source, allow the reverse blocking transistor 91 to be pulled down to 0V when the channel is in the off state.

A backup diode 92, consisting of a low forward drop Schottky power diode is included in the circuit to allow operation if the reverse blocking transistor 91 fails or there is a failure in the charge pump path driving the gate. If only one or a small number of channels are in this faulted condition, a resulting temperature increase can be tolerated. This component also allows the reverse blocking transistor control to default the reverse blocking transistor 91 to the 'off' state for low load currents, and only turn it on via charge pump signal 732 for currents above a given threshold, where it is important to reduce heat dissipation in the output channel. For low currents the heat dissipation produced by the voltage drop of backup diode 92 is negligible, but if all channels were operating at high output currents the cumulative aggregate heat buildup would be excessive.

Figure 13:
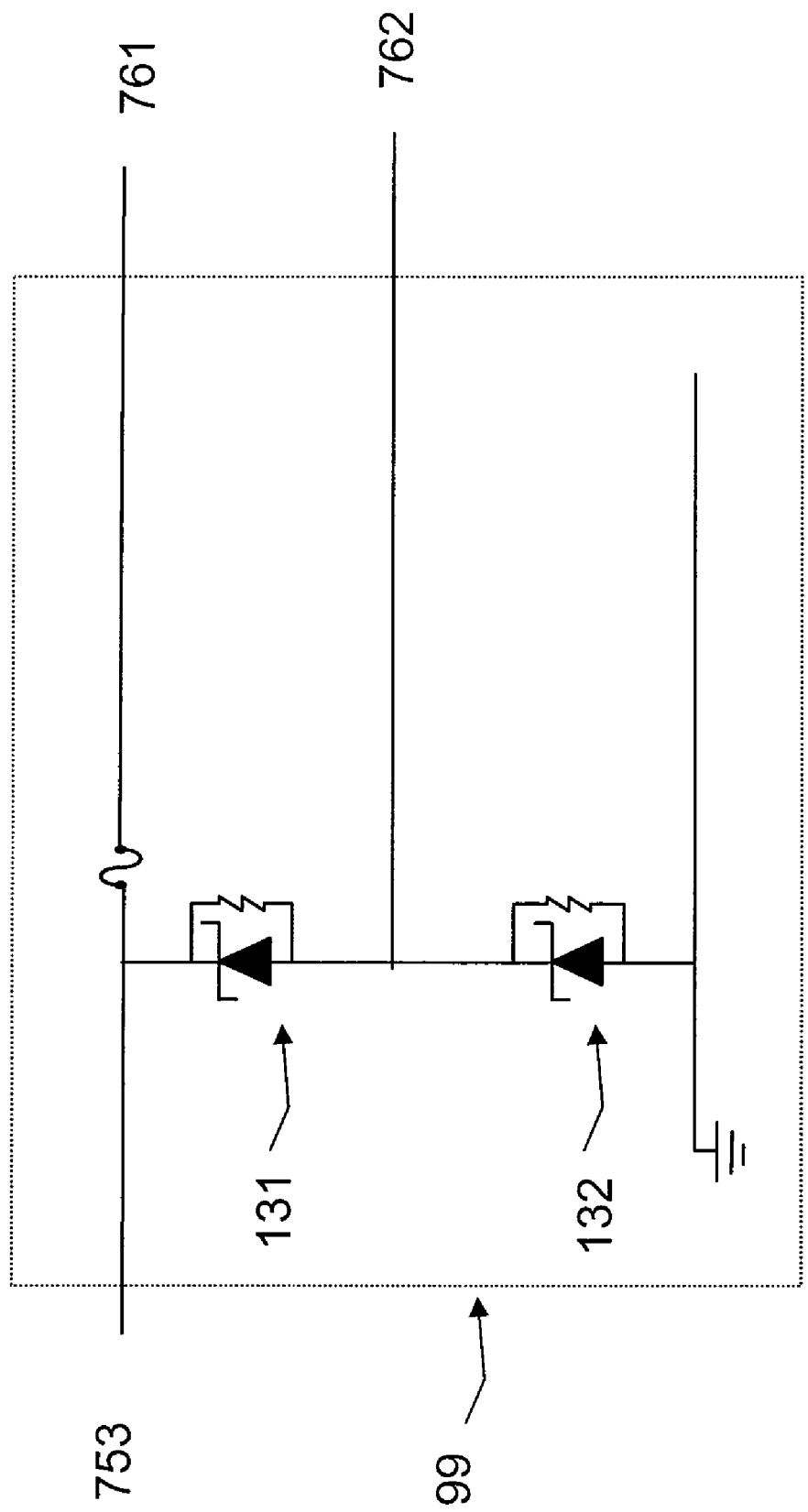
FIG. 13 illustrates a protection network according to the present invention.

A further aspect of the preferred embodiment of the invention is the protection of the digital output channels and their loads from over-voltage transients. The transient suppression module 99 will now be described in more detail with reference to FIG. 13.

The transient suppression module 99 receives the channel output signal 753 via the reverse blocking transistor 91 and provides signal 761 to drive the channel load and signal 762 to the voltage monitors and A/D converters 78b. The module comprises two avalanche diodes 131, 132 in series, and two resistors 133, 134 one parallel with each avalanche diode and forming a voltage divider across them.

This allows the avalanche diodes to be continuously monitored for short circuit faults when the channel is in the energized state.

Short circuit failures are the predominant failure mode for this type of device, so the resulting diagnostic coverage is very beneficial.

During the test sequence illustrated in FIG. 10, when the channel is in an 'on' state and is being tested for the ability to be de-energised, the reverse blocking circuit 76 may be used as described previously to break the connection between the channel failsafe switch 75 and the channel load prior to starting the test sequence. This enables the channel to be tested for the ability to be de-energised even when another parallel channel is energising the load.

Thus when the drive signal 721 is ramped up and the FET 801, 802 under test starts to turn off the measured voltage 752 across a self-diagnostic "turn-off test" resistor 33 will drop as illustrated in FIG. 10 to indicate that the FET 801, 802 is successfully being de-energised. This voltage decrease is independent of the load current, and applies equally well to the case where another output channel is energizing the load in parallel.

As a prerequisite to guard against latent open circuit failures of an output channel not being tested, and to prevent an inadvertent de-energisation of the load, the comparators 83 may be used to verify that when an output channel under test is turned off the load voltage stays up or is maintained at a desired value.

Thusly qualified, the output channel under test may simply be commanded to turn off one switch at a time and verify that the top VMON signal 752 (FIG. 12) decays when the reverse blocking circuit breaks the connection between the channel failsafe switch 75 and the channel load.

An exemplary application of this method employs a software test executive operating as part of processor assembly 24. The software test executive has the responsibility to set the current and voltage (IMON and VMON) thresholds and to trigger the start of the ramp tests. After a given ramp test has completed, the software test executive examines the results to assess whether a threshold has been crossed. Some tests are guard tests, or tests performed before the execution of the normal test, and a threshold crossing observed during the execution of a guard test indicates the presence of a fault in the other FET, and registers or provides an indication or instruction that the normal test should not be performed, or the load will experience an unintentional change of state. If the guard tests complete successfully, that is without a threshold crossing, then the normal ramp test may be performed without concern over bumping of the load. An expected result of the subsequent normal test is for the IMON or VMON thresholds to be crossed during the ramp of the FET towards the opposite state. The absence of a threshold crossing would be indicative of a fault being present in the FET being ramped.

One benefit of the above method is to provide accurate detection of short circuit load faults for a de-energized channel. This is done by storing both the IMON and VMON A/D values when one or the other crosses the specified threshold. By computing the ratio of load voltage to load current at the time of the trip or crossing of the threshold, the load resistance can be estimated. If the estimated load resistance is below a determined threshold, for example 12 ohms for a 24V 1 amp nominal application, then the user may be alerted to an abnormal field condition so that repair operations may be performed before the load is actually energized. Avoidance of such occurrences reduces the detrimental consequences commonly associated with such events.

It will be appreciated that certain features of the invention, which are, for clarity, described in the context of separate embodiments, may also be provided in combination in a single embodiment. Conversely, various features of the invention which are, for brevity, described in the context of a single embodiment, may also be provided separately, or in any suitable combination.

It is to be recognized that various alterations, modifications, and/or additions may be introduced into the constructions and arrangements of parts described above without departing from the scope of the present invention as defined in the appended claims.

The invention claimed is:

1. A method of testing an output channel, the output channel comprising a transistor having a gate, a source, and a drain, and driving a load with a load voltage and a load current in dependence upon a gate drive signal applied to the gate and generated from a command signal and a ramp signal, the method comprising:
   determining a voltage threshold;
   determining a current threshold;
   monotonically varying the gate drive signal from a starting value for a predetermined time interval;
   monitoring the load current;
   monitoring the load voltage; and
   returning the gate drive signal generated from the command signal and the ramp signal to the starting value if the load voltage reaches the voltage threshold, the load current reaches the current threshold, or the predetermined time interval expires.

2. A method according to claim 1, in which the gate drive signal is generated by an operational amplifier that receives the command signal and the ramp signal and, in the event a monotonically varying gate drive signal is to be generated, the ramp signal comprises a high frequency pulsed signal.

3. A method according to claim 1, in which the output channel further comprises a transient suppression module comprising two avalanche diodes in series with two resistors in parallel with and forming a voltage divider across the avalanche diodes and in which the method further comprises using the monitored load current and the monitored load voltage to detect short circuit faults of the avalanche diodes.

4. A method according to claim 1, in which the gate drive signal starting value causes the load to be energised and in which monotonically varying the gate drive signal causes the load to become partially de-energised.

5. A method according to claim 1, in which the gate drive signal starting value causes the load to be de-energised and in which monotonically varying the gate drive signal causes the load to become partially energised.

6. A method according to claim 1, further comprising:
   breaking the connection between the output channel and the load; and
   monitoring a voltage across a test resistor.

7. A method of testing an output channel that includes a first and a second transistor in series, the first transistor having a first gate, a first source, and a first drain, the second transistor having a second gate, a second source, and a second drain; the first and second transistors driving a load with a load voltage and a load current in dependence upon a first gate drive signal applied to the first gate and a second gate drive signal applied to the second gate, the method comprising:
   determining a voltage threshold;
   determining a current threshold;
   monotonically varying one of said gate drive signals from a starting value for a predetermined time interval;
   monitoring the load current;
   monitoring the load voltage;
   breaking the connection between the output channel and the load;
   monitoring a voltage across a test resistor; and
   in the event that the load voltage reaches the voltage threshold, or the load current reaches the current threshold, or the predetermined time interval expires, returning the one of the gate drive signals to the starting value.

8. The method of claim 7 further comprising monotonically varying the other of the gate drive signals from a second starting value for a second predetermined time interval that does not overlap the predetermined time interval.

9. The method of claim 8 wherein the second predetermined time interval and the second starting value have values that are generally similar to the predetermined time interval and the starting value.

10. An apparatus comprising:
   an output channel comprising a transistor having a gate, a source, and a drain, a reverse blocking circuit and a test resistor in parallel with a load and configured to drive the load with a load voltage and a load current in dependence upon a gate drive signal applied to said gate;
   a driver that generates the gate drive signal; and
   a processor that controls the driver and is connected to receive signals indicating the load voltage and the load current; the processor being arranged to control the driver to monotonically vary the gate drive signal from a starting value for a predetermined time interval; and
   monitor the load current;
   monitor the load voltage;
   monitor the voltage across said test resistor;
   cause the reverse blocking circuit to break a connection between the channel and the load;
   controls the driver to set the gate drive signal starting value to cause the load to be energised to monotonically vary the said gate drive signal to cause the load to become partially de-energised; and
   returns the gate drive signal to the starting value if at least one of the load voltage reaches a predetermined voltage threshold, the load current reaches a predetermined current threshold, or the predetermined time interval expires.

11. An apparatus according to claim 10, in which the driver comprises an operational amplifier that receives a command signal and a ramp signal, the ramp signal being a high frequency pulsed signal when a monotonically varying gate drive signal is to be generated.

12. An apparatus according to claim 10, the output channel further comprises a transient suppression module that includes two avalanche diodes in series with two resistors in parallel with, and forming a voltage divider across, the avalanche diodes; and in which the processor is further arranged in operation to use the monitored load voltage to detect short circuit faults of the avalanche diodes.

* * * * *